(12) United States Patent
Thomas et al.

(10) Patent No.: US 11,290,033 B2
(45) Date of Patent: Mar. 29, 2022

(54) DEVICES AND METHODS FOR GENERATING ELECTRICITY

(71) Applicant: PARAGRAF LIMITED, Somersham (GB)

(72) Inventors: Simon Thomas, Somersham (GB); Ivor Guiney, Somersham (GB)

(73) Assignee: Paragraf Limited, Somersham (GB)

( * ) Notice: Subject to any disclaimer, the term of this patent is extended or adjusted under 35 U.S.C. 154(b) by 0 days.

(21) Appl. No.: 17/042,299

(22) PCT Filed: Mar. 26, 2019

(86) PCT No.: PCT/GB2019/050853
§ 371 (c)(1),
(2) Date: Sep. 28, 2020

(87) PCT Pub. No.: WO2019/186136
PCT Pub. Date: Oct. 3, 2019

(65) Prior Publication Data
US 2021/0021213 A1 Jan. 21, 2021

(30) Foreign Application Priority Data
Mar. 26, 2018 (GB) ...................................... 1804790

(51) Int. Cl.
*H02N 3/00* (2006.01)
*C01B 32/186* (2017.01)
(Continued)

(52) U.S. Cl.
CPC ............. *H02N 3/00* (2013.01); *C01B 32/186* (2017.08); *C23C 16/26* (2013.01); *F03B 17/06* (2013.01);
(Continued)

(58) Field of Classification Search
CPC ........ H02N 3/00; H02N 2/185; C01B 32/186; C01B 2204/02; C01B 2204/04;
(Continued)

(56) References Cited

U.S. PATENT DOCUMENTS

2016/0115032 A1 4/2016 Wodtke
2017/0057826 A1 3/2017 Strudwick et al.

FOREIGN PATENT DOCUMENTS

CN 102307024 * 1/2012 ............... H02N 3/00
CN 102307024 A 1/2012

OTHER PUBLICATIONS

Yin, et al., Generating electricity by moving a droplet of ionic liquid along graphene, Nature Nanotechnology 2014; 9: 378-383 (Year : 2014).*

(Continued)

*Primary Examiner* — Daniel C. McCracken
(74) *Attorney, Agent, or Firm* — Stinson LLP

(57) ABSTRACT

An array of graphene sheets configured to generate electricity from a flow of an ion-containing fluid, wherein the array comprises a plurality of graphene sheets, each graphene sheet comprising first and second electrical contacts, having a surface extending between the first and second electrical contacts for contacting the flow of ion-containing fluid, and wherein each graphene sheet is in electrical contact with at least a further graphene sheet.

22 Claims, 2 Drawing Sheets

(51) Int. Cl.
  *C23C 16/26*     (2006.01)
  *F03B 17/06*     (2006.01)
  *B82Y 30/00*     (2011.01)
  *B82Y 40/00*     (2011.01)

(52) U.S. Cl.
  CPC .............. *B82Y 30/00* (2013.01); *B82Y 40/00* (2013.01); *C01B 2204/02* (2013.01); *C01B 2204/04* (2013.01); *C01B 2204/22* (2013.01)

(58) Field of Classification Search
  CPC ... C01B 2204/22; C01B 32/182; C23C 16/26; F03B 17/06; B82Y 30/00; B82Y 40/00; Y02E 10/30; H01L 29/1606
  See application file for complete search history.

(56) References Cited

OTHER PUBLICATIONS

Guiney, et al., Single-step manufacturing process for the production of graphene—V/III LED heterostructures, Proceedings of SPIE 2017; 10124: 101240D-1 to 101240D-8 (Year: 2017).*
Lin Meng-Yu et al., "The growth mechanism of graphene directly on sapphire substrates by using the chemical vapor deposition," Journal of Applied Physics, vol. 115, 2014, pp. 223510-1 to 223510-5.
Minghui Ye et al., "Graphene Platforms for Smart Energy Generation and Storage," Joule, vol. 2, Feb. 1, 2018, pp. 245-268.
Jun Yin et al., "Generation electricity by moving a droplet of iconic liquid along graphene," Nature Nanotechnology, vol. 9, Apr. 6, 2014, pp. 378-383.
Jun Yin et al., "Harvesting Energy from Water Flow over Graphene?" Nano Letters, vol. 12, Mar. 14, 2012, pp. 1736-1741.
International Search Report and Written Opinion, PCT/GB2019/050853, dated Jul. 2, 2019, 15 pages.
Abstract of CN102307024; Jan. 4, 2012.
Combined Search and Examination Report for GB 1804790.2, dated Sep. 14, 2018, 6 pages.

* cited by examiner

DEVICES AND METHODS FOR GENERATING ELECTRICITY

REFERENCE TO RELATED APPLICATION

This application is a U.S. national stage application based on PCT/GB2019/050853, filed Mar. 26, 2019, claiming priority to Great Britain application no. 1804790.2, filed Mar. 26, 2018, the entire disclosures of which are incorporated herein by reference.

FIELD OF THE INVENTION

The present invention relates to the use of graphene sheets to generate electricity from a flow of an ion-containing fluid. In particular, the invention provides an array of such sheets for use in a wide range of applications for the generation of electricity, including, for example, from wave power.

BACKGROUND

Modern society uses large amounts of electricity. The majority of the demand for electrical power is met by power plants that convert other forms of energy into electrical power. Most of the world's electrical power is currently generated by burning of fossil fuels to produce steam which drives turbines which generate electricity. However, there are a number of problems associated with conventional power generation.

While the world's supply of fossil fuels is large, it is finite and non-renewable. Additionally, power generation must compete with other uses of fossil fuels such as plastic manufacture.

More importantly, the burning of fossil fuels releases gases which have significant negative impact on the environment. Primarily fossil fuel combustion releases $CO_2$. The link between $CO_2$ and climate change is well accepted and there is increasing pressure to reduce the release of $CO_2$. Additionally, fossil fuel combustion leads to the emission of small amounts of other gases such as ozone, sulfur dioxide and nitrogen oxides. These gases also have impacts on the environment.

Accordingly, there is a desire to replace fossil fuel combustion with other methods of meeting the worlds increasing electrical power demand. Whilst a number of alternative energy sources have been investigated and implemented, such as hydroelectric power, tidal power, wind power and geothermal power, they do not meet the global electricity demand, and there remains a need for further alternative sources of electrical power.

It is known that an electric potential can be produced by passing a flow of ionic or ion-containing fluid through holes or channels. It is also known that an electric potential may be generated by carbon nanotubes submerged in a flow of ionic fluid.

It has also been reported (Generating electricity by moving a droplet of ionic liquid along graphene, Nature Nanotechnology volume 9, pages 378-383, 2014) that an electric potential may be produced by flowing an ionic fluid over the surface of graphene.

However, known methods and devices have not been able to be produced in a quantity and/or at a cost that makes them industrially useful and commercially viable. Additionally, the device fabrication is challenging as thin graphene sheets must be incorporated into devices such that the flow of ion-containing fluid does not destroy the device.

Graphene is a well-known material with a plethora of proposed applications driven by the material's theoretical extraordinary properties. Good examples of such properties and applications are detailed in 'The Rise of Graphene' by A. K. Geim and K. S. Novoselev, Nature Materials, vol. 6, March 2007, 183-191.

WO 2017/029470, the content of which is incorporated herein by reference, discloses methods for producing two-dimensional materials. Specifically, WO 2017/029470 discloses a method of producing two-dimensional materials such as graphene, comprising heating a substrate held within a reaction chamber to a temperature that is within a decomposition range of a precursor, and that allows graphene formation from a species released from the decomposed precursor; establishing a steep temperature gradient (preferably >1000° C. per meter) that extends away from the substrate surface towards an inlet for the precursor; and introducing precursor through the relatively cool inlet and across the temperature gradient towards the substrate surface. The method of WO 2017/029470 may be performed using vapour phase epitaxy (VPE) systems and metal-organic chemical vapour deposition (MOCVD) reactors.

The method of WO 2017/029470 provides two-dimensional materials with a number of advantageous characteristics including: very good crystal quality; large material grain size; minimal material defects; large sheet size; and are self-supporting. However, there remains a need for fast and low-cost processing methods for fabricating devices from the two-dimensional materials.

CN 102307024 discloses a graphene-based fluid power generating device for fluctuation sensing device.

US 2016/0115032 discloses graphene with a very high charge carrier mobility and preparation thereof.

US 2017/0057826 discloses substrate pre-treatment for consistent graphene growth by chemical deposition.

SUMMARY OF THE INVENTION

Accordingly, it is desirable to provide a further use for graphene that tackles at least some of the problems associated with the prior art or, at least, to provide a commercially useful alternative thereto.

According to a first aspect, there is provided an array of graphene sheets configured to generate electricity from a flow of an ion-containing fluid, wherein the array comprises a plurality of graphene sheets, each graphene sheet comprising first and second electrical contacts, having a surface extending between the first and second electrical contacts for contacting the flow of ion-containing fluid, and wherein each graphene sheet is in electrical contact with at least a further graphene sheet.

DETAILED DESCRIPTION OF PREFERRED EMBODIMENTS

Figure 1:
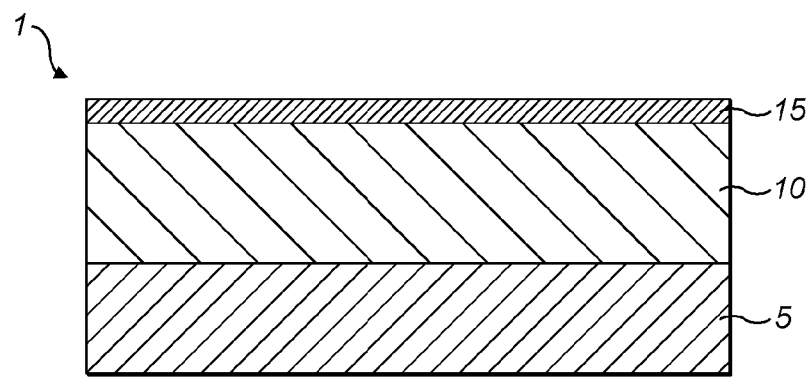
FIG. 1 shows a cross section through a suitable wafer.

The present invention will now be further described. In the following passages different aspects of the invention are defined in more detail. Each aspect so defined may be combined with any other aspect or aspects unless clearly indicated to the contrary. In particular, any feature indicated as being preferred or advantageous may be combined with any other feature or features indicated as being preferred or advantageous.

The present invention depends on the provision of graphene sheets. By the term "graphene sheet" it is meant a stack of from 1 to 50 graphene monolayers on a substrate.

The provision of high-quality graphene sheets is key to the application of the invention. In particular, for some applications it is key that the sheets are sufficiently large to provide a low-cost solution. In other applications it is key that the graphene sheets are sufficiently thin that they are optically transparent. In still other applications it is key that the graphene sheets are sufficiently robust, i.e. are substantially devoid of weaknesses arising from structural imperfections.

The invention relies on the provision of an array of graphene sheets. The term array will be understood to mean an ordered arrangement of electrically connected graphene sheets. Suitable arrays may include regular grids such as a chessboard arrangement (grid of squares) or a honeycomb arrangement (grid of hexagons). Alternatively, the array may comprise a number of circular sheets or a combination of different shape sheets.

The array of the present invention may be planar or approximately planar when used in a planar device such as a solar panel or a window. Alternatively, the array of the invention may be curved when used in a curved device such as on the surface of a pipe.

The array is configured to generate electricity from a flow of an ion-containing fluid. That is, array is configured such that in use a flow of ion-containing fluid across the surface of the sheets will drive a current around a circuit connected to the array.

The terms ion-containing fluid and ionic fluid used herein relate to a fluid containing charged species. That is, these terms are not intended to be limited to molten salts, but also encompass solutions containing charged species such as water, particularly sea water or rainwater as well as waste fluids such industrial or agricultural drainage, run off from chemical plants or power plants.

While any fluid containing charged species may be used, it will be appreciated that the ion concentration will affect the power generated by the device. However, the choice of ion-containing fluid is not otherwise limited.

The array comprises a plurality of graphene sheets, each graphene sheet comprising first and second electrical contacts. In some embodiments each graphene sheet may have more than these two electrical contacts.

There is a graphene surface extending between the first and second electrical contacts for contacting the flow of ion-containing fluid. In use the sheets are arranged such that the flow of ion-containing fluid moves across the graphene surface substantially a single direction, such as from the first contact towards the second contact.

Each graphene sheet is in electrical contact with at least a further graphene sheet. As will be appreciated, the number of connections will depend on whether the sheets are wired in parallel or in series and where each sheet is located in the array. A sheet in the middle of a chain will have at least two connections to adjacent graphene sheet, whereas a sheet at the end of a chain will may only have a single connection to a further sheet and a contact for connection to an external circuit.

Preferably the graphene sheets are in electrical contact in series or in parallel. This may affect the current or voltage produced. That is, altering the configuration of the electrical connections between the sheets in a given array may allow tuning of the voltage and/or current produced by the array.

Preferably the first and second electrical contacts are located at distal portions of each graphene sheet. This maximises the area of the graphene sheet over which the ion-containing fluid may flow and produce a usable potential difference.

The graphene sheets may be provided with electrical contacts for connection to an external circuit such as a DC-DC boost converter. In this way, the voltage generated by an individual sheet or array can either be added up, or else amplified using a boost circuit. Other electrical components are well known in the art such as rectifiers and diodes.

Devices comprising the array of the present invention may contain any suitable electrical components which would be known to the person skilled in the art.

Preferably the plurality of graphene sheets each have a tessellating shape, preferably hexagonal, square or rectangular. This minimises wasted space on the device surface.

Preferably the array is obtainable by the deposition of graphene on a surface of a substrate by MOCVD or CVD.

MOCVD refers to metal-organic chemical vapour deposition. While the name refers to metal-organics, MOCVD is a term in the art and would be understood to relate to the general process and the apparatus used therefor and would not necessarily be considered to be restricted to the use of metal-organic reactants or to the production of metal-organic materials. Instead, the use of this term indicates to the person skilled in the art a general set of process and apparatus features.

Preferably the surface of the substrate comprises AlN, GaN, AlGaN, BN, InGaN and SiN. Such a substrate provides a particularly strong bond to the graphene. Advantageously this leads to a improved device lifetime since the device is able to withstand the physical force of the fluid flow over the graphene surface for longer periods whilst remaining intact. In a preferred example, the substrate comprises AlN.

Preferably the substrate comprises a support selected from the group consisting of Si, $SiO_2$, SiC or Sapphire. More preferably the substrate comprises a sapphire support. In some embodiments the graphene is deposited directly on the support without an intervening surface layer, such as the AlN mentioned above.

Preferably at least two or more of the graphene sheets of the array share a common substrate. That is, while the graphene sheets are electrically isolated, they are physically linked together with a single underlying substrate. In a preferred embodiment the graphene sheets are made from a single wafer of graphene which is then divided, such as by laser etching, to electrically isolate each sheet.

The array of the invention may comprise a plurality of wafers electrically connected together. Each of said wafers may be divided into a plurality of sheets as discussed above.

Preferably the graphene sheets each comprise from 1 to 50 graphene monolayers layers. Preferably the graphene sheets each comprise from 1 to 20, more preferably from 1 to 10 graphene monolayers, most preferably 3 to 10. The presence of more than one layer facilitates doping.

Preferably the graphene sheets are doped. The number of dopant atoms in the layer increases the voltage generated. As a consequence, higher levels of doping are preferred. The inventors have found that the exact choice of dopant is not especially critical, so long as the electrical conductivity is maintained. The inventors have investigated and had success with at least the following dopants: Br, N, Mg and P. Accordingly, the currently preferred dopants are one of more of Br, N, Mg and P.

The quality of the electrical connection affects the efficiency of the device in terms of the electrical power which may be extracted. Providing electrical contacts on a graphene device can be challenging. In one embodiment the contacts comprise chromium and/or gold deposited onto the graphene surface. Such contacts may be deposited by known methods such as electron beam deposition preferably using a mask.

A mechanical clip or clamp may be used as part of the electrical contact to improve the electrical connection.

It will be appreciated that specific position and arrangement of the contacts may affect the flow of fluid over the graphene surface. Accordingly, the preferred arrangement of the contacts may vary between specific devices into which the array is incorporated.

In particular, contacts which represent an obstruction to the fluid flow may lead to non-laminar flow and reduce the electric power generated. In a preferred embodiment the contacts are arranged to avoid such non-laminar flow. The arrangement of the contacts would be understood to mean both the shape of the contacts as well as the position of the contacts on the sheet.

Preferably the electrical contacts are insulated from the ion-containing fluid.

According to a further aspect, there is provided a method of making the array described herein, the method comprising:
  providing a plurality of supports selected from the group consisting of Si, $SiO_2$, SiC or Sapphire;
  forming a semiconductor layer on each of the supports by MOCVD;
  forming a graphene layer structure having from 1 to 50 layers on each semiconductor layer by MOCVD to form a graphene sheet thereon;
  forming first and second electrical contacts on each graphene sheet; and
  electrically connecting each graphene sheet to at least a further graphene sheet.

In this aspect the method involves the connection of multiple separately manufactured graphene sheets.

According to a further aspect, there is provided a method of making the array described herein, the method comprising:
  providing a support selected from the group consisting of Si, $SiO_2$, SiC or Sapphire;
  forming a semiconductor layer on the support by MOCVD;
  forming a graphene layer structure having from 1 to 50 layers on the semiconductor layer by MOCVD;
  dividing the graphene layer structure into electrically isolated graphene sheets on the semiconductor layer;
  forming first and second electrical contacts on each electrically isolated graphene sheet;
  electrically connecting each graphene sheet to at least a further graphene sheet.

In this aspect a single graphene sheet is manufactured, which is then divided into separate sub-sheets or strips which are then reconnected to form the array. There may be benefits associated with having multiple smaller graphene sheets in some embodiments, rather than having a single larger wafer.

The component of the ion-containing fluid flow in the direction between the contacts affects the electrical power generated. Flow orthogonal to this direction may produce less usable potential and a flow in the opposite direction may drive current in the wrong direction. Accordingly, the shape and arrangement of the sheets, as well as the positioning of the electrical connections may be optimised based on the specific device into which the array will be incorporated.

According to a further aspect there is provided a device for generating electrical energy from a flow of an ion-containing fluid, the device comprising one or more arrays as described herein.

In several devices the one or more arrays are arranged to generate electricity from a flow of rain water as the ion-containing fluid. Examples of this type of device include a surface of a roof tile, a wall panel, a car body panel, a drainage duct.

In several devices the one or more arrays are optically transparent. Examples of this type of device include where the one or more arrays form a surface of a window or a solar panel.

It would be appreciated that where a transparent array is required the selection of substrates will be limited to transparent substrates. Suitable transparent substrates are well known to the skilled person. For example, where a transparent array is required the substrate may comprise InGaN.

In several devices the one or more arrays are arranged to generate electricity from a flow of sea water as the ion-containing fluid. Examples of this type of device include where the arrays form a surface of a hull of a boat, or a tidal power generator (such as a duct or panel within a tidal power generator).

In several devices the one or more arrays are arranged to generate electricity from a flow of waste fluid, preferably wherein the arrays form a surface of a sanitary-ware product, or a duct for sewage or farm drainage. Other suitable waste drainage ducts include the run-off from industrial plants (such as chemical plants, nuclear, pharmaceutical, dairy, etc.).

Devices of the invention may include arrangements so that in use the ion-containing fluid is directly supplied as a flow falling from a height onto the array. Alternatively, the device may comprise a reservoir arranged above the array to supply, in use, a flow of ion-containing fluid onto the array. In a preferred embodiment a device of the invention comprises a small diameter opening directly over the graphene sheet, ideally the opening is in a reservoir arranged to hold the ion-containing fluid.

The graphene sheets in the array of the device are arranged at an angle to the horizontal so that the ion-containing fluid flows across the surface.

It should be appreciated that the generation of electricity in this way may detract from the performance of the larger system in which the device is included if it decreases the rate of flow of the ion-containing fluid over the surface. By way of example, for a boat, the device could increase drag on the hull. Similarly, a car body panel might increase the weight of the car in motion. Under such circumstances the circuit could be disabled. However, when the car is parked or the boat is at rest, the system can then be engaged to draw on the current which can be produced.

According to a further aspect, there is provided a method of generating electrical energy from the array described herein, preferably when the array is included in one of the devices discussed above, the method comprising arranging the array in a flow-path of an ion-containing fluid, whereby the ion-containing fluid passes across the surface of the array to generate a current.

FIG. 1 shows a cross section through a wafer in accordance with the present invention. The wafer (1) comprises a sapphire substrate (5) with an overlying layer of aluminium nitride (10). On top of the aluminium nitride layer there is provided a graphene sheet (15). The graphene sheet (15) is comprised of five graphene monolayers, each of which has been doped with nitrogen.

The wafer (1) is obtained by placing the sapphire substrate (5) in an MOCVD device. The layer of aluminium nitride (10) is grown thereon by vapour deposition methods known in the art. The graphene layer (15) is then grown on the aluminium nitride layer (10) in the same reaction chamber without being removed during processing.

Figure 2:
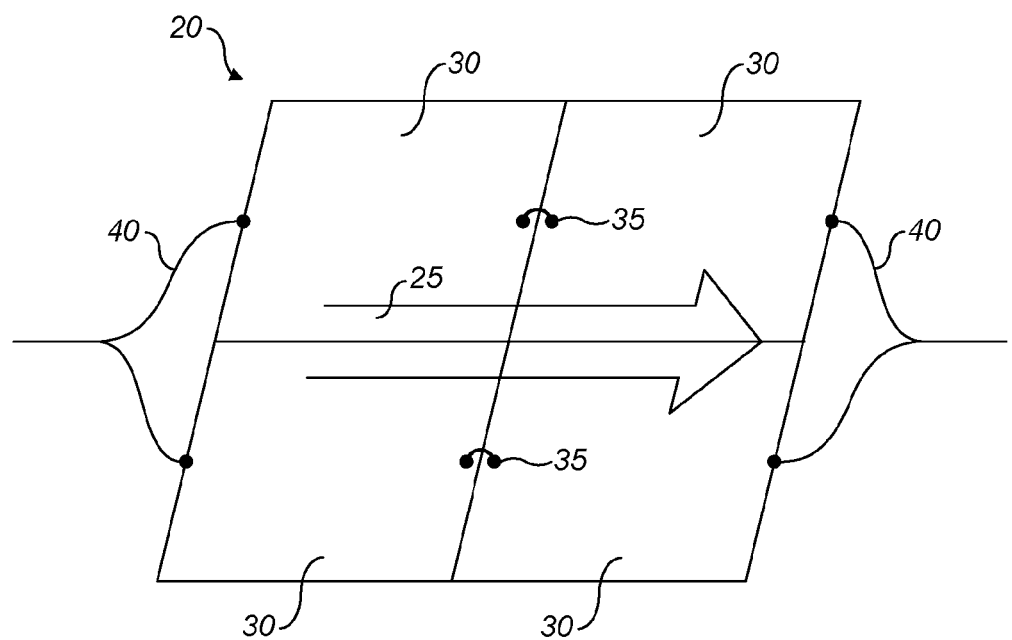
FIG. 2 shows one electrical configuration of an array in accordance with the invention.

FIG. 2 shows an array (20) for generating electricity from a flow (25) of an ion-containing fluid. The array (20) is comprised of graphene sheets (30). Each graphene sheet (30) is comprised of a substrate (5) on which a graphene layer (15) has been provided. The graphene sheets (30) may be formed on a single shared substrate (5) or may be formed separately.

Electrical connections (35) are provided to link each graphene sheet to at least a further graphene sheet. Electrical connections (40) are provided in order to connect the end graphene sheets (30) to a wider electrical circuit (not shown).

In use, the flow of an ion-containing fluid (25) passing along each graphene sheet (30) and between electrodes (35,40) causes an electrical potential to be produced and drive a current around the external circuit.

Figure 3:
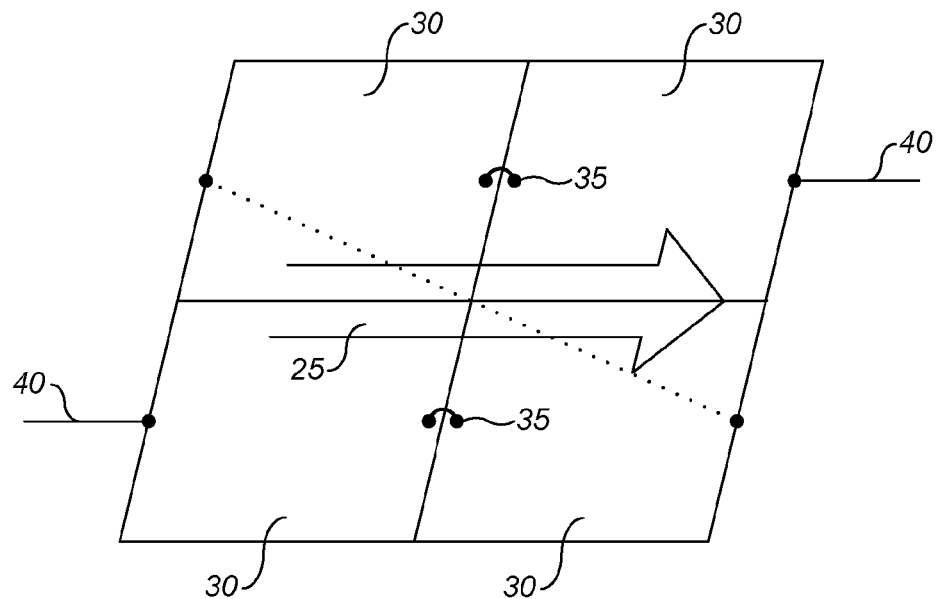
FIG. 3 shows one an alternative electrical configuration of an array in accordance with the present invention.

The embodiment shown in FIG. 2 has the graphene sheets wired in parallel whereas the embodiment in FIG. 3 shows a configuration with the graphene sheets (30) provided in series.

Figure 4:
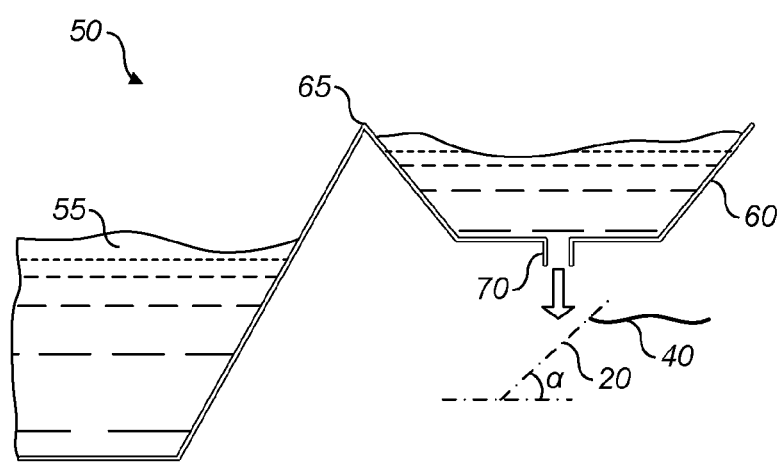
FIG. 4 shows a schematic diagram of a device of the present invention.

FIG. 4 shows a device (50) for harvesting electricity from sea water (55).

The device comprises a reservoir (60) located above a graphene array (20) connected by connections (40) to an external circuit.

In use, sea water (55) washes over an edge (65) of the reservoir (60). This ensures a continuous supply of water in the reservoir (60). Water flows in a continuous manner from the reservoir (60) through outlet (70) onto the array (20). Ideally, the array (20) is oriented at an angle α to the horizontal so that the ion-containing sea water (55) washes down over the surface of the array (20) between pairs of contacts (35, 40, not shown in this Figure). Preferably a is in the region of 70°.

EXAMPLES

The invention will now be described in more detail with reference to the following non-limiting examples.

The following example explains how to create one or more monolayers of graphene on an aluminium nitride (AlN) layer which is in turn grown on a sapphire substrate, using the process of Metal Organic Chemical Vapour Deposition (MOCVD), delivering high quality, high mobility material. This is followed by a description of how to create a voltage generation cell using this wafer-scale graphene material.

AlN+Graphene Growth

I. Wafer(s) of sapphire are loaded into an MOCVD reactor chamber.
II. The reactor is closed which results in the gas injectors being located 10-11 mm above the substrate surface. In this case, smaller gaps than 10 mm may also be beneficial, particularly for AlN growth.
III. The reactor chamber is pump-purge cycled to remove any presence of the ambient environment.
IV. A gas flow of 20 slm of hydrogen is introduced to the reactor and remains on constantly until the AlN layer is grown.
V. The reactor pressure is reduced to 50 mbar.
VI. The reactor temperature and by association the wafer(s) are heated up to 930° C.
VII. The temperature is allowed to stabilise for 3 minutes after reaching the set-point.
VIII. Trimethyl aluminium (TMAl) is introduced to the reactor chamber via gas stream pick up from a liquid source at a flow of 0.02 slm for a period of 20 seconds. This allows a very thin layer of TMAl to form.
IX. Ammonia ($NH_3$) gas is next introduced at a flow of 0.05 slm for 5 minutes to grow approximately 20 nm of AlN on the sapphire wafers.
X. The TMAl flow is turned off and the reactor temperature and by association the wafer(s) are heated up to 1190° C. During this time, the $NH_3$ flow is reduced to 0.03 slm.
XI. The temperature is allowed to stabilise for 3 minutes after reaching the set-point.
XII. The TMAl is reintroduced as in step VIII, at the same flow rate. Both $NH_3$ and TMAl are left on for a period of 1 h 20 mins in order to grow approximately 200 nm of AlN.
XIII. Next, while still at 1190 C, the $NH_3$ and TMAl flows are turned off. The total flow of carrier gas is reduced from 20 slm to 16 slm, and the carrier gas is changed from hydrogen to nitrogen.
XIV. The flow of nitrogen is allowed to continue for 1 minute, to ensure that all hydrogen is purged from the reactor
XV. Dibromomethane is introduced to the reactor chamber via gas stream pick up from a liquid source at a flow of 0.009 slm for a period of 4 minutes and 20 seconds.

The above conditions are sufficient for three monolayers of graphene to form.
XVI. The flow of dibromomethane to the reactor chamber is turned off.
XVII. The reactor is cooled to room temperature in 15 minutes, with nitrogen still flowing.
XVIII. The reactor chamber is increased back to atmospheric pressure using nitrogen gas.
XIX. The wafers are now ready to be unloaded.

The above process can be varied to produce graphene with slightly varying properties, such as carrier concentration and thickness, by modifying some of the variables, such as gas flow rates, growth time, precursor flow rate, choice of precursor, substrate temperature, substrate material, dopant element and dopant amount.

Voltage Generation Cell Fabrication

The following fabrication process uses graphene on AlN on sapphire substrates, produced using the process detailed above. As indicated previously, other substrates can also be used.

I. A mask is placed over the graphene wafer leaving only the areas where electrical contacts are required exposed.
II. Two electrical contacts comprising of 5 nm of chromium and 70 nm of gold are deposited onto the graphene surface, through the mask using a standard metal depositing technique, such as electron-beam deposition.
III. The wafer is removed from the metal deposition system and the mask is removed from the wafer.

IV. The wafer is placed onto a holder, which angles the wafer at 70 degrees to the horizontal. The two electrical contacts are contacted by aluminium clips.

V. The clips are in turn connected to either another wafer grown and patterned in the same way, or else to an external circuit such as a DC-DC boost converter. In this way, the voltage generated by an individual wafer or cell can either be added up, or else amplified using a boost circuit.

The graphene layer may be separated into a number of sub-sheets by laser ablation or other suitable known methods and then reconnected in series or parallel to provide an array of a single substrate or may be used whole as a single sheet as described above.

Voltage Generation Cell Operation

The following fabrication process uses graphene on AlN on sapphire substrates, produced using the processes detailed above.

I. A small reservoir is positioned 5 cm above the graphene cell(s) which may or may not have external circuitry attached.

II. An ionic fluid (eg. seawater) is dropped through a 5 mm diameter opening in the reservoir onto the graphene material. The wafer is orientated such that the fluid flows between the electrical contacts.

III. A small voltage, of the order of 0.4V is generated by the drops of fluid, and is fed either directly from the wafers or taken from the boost circuitry, into a battery or other item as required.

The inventors investigated further devices including:

Device 1: Using one wafer of graphene/AlN/sapphire such as that described in section 1, connected directly to a small battery. This setup gave approximately 0.2V or approximately 1 mW of power.

Device 2: Using the wafer connected with the two electrical contacts directly to a DC-DC boost converter and capacitors to output upwards of 50 mW. An example of commercial integrated circuit for this would be an EnOcean ECT 310.

It is considered that with 100 pieces of graphene in series either as a standalone circuit fed directly into a battery, or connected to appropriate diode and capacitor circuitry, it would be possible to give a few watts of power. Additionally, 1,000,000 strips (sub-sheets) of graphene in series with appropriate diode and capacitor circuitry would give several MW of power.

Although preferred embodiments of the invention have been described herein in detail, it will be understood by those skilled in the art that variations may be made thereto without departing from the scope of the invention or of the appended claims.

The invention claimed is:

1. An array of graphene sheets configured to generate electricity from a flow of an ion-containing fluid;
wherein the array is obtainable by the deposition of graphene on a surface of a substrate by MOCVD or CVD and comprises a plurality of graphene sheets, each graphene sheet comprising first and second electrical contacts, having a surface extending between the first and second electrical contacts for contacting the flow of ion-containing fluid;
wherein each graphene sheet is in electrical contact with at least a further graphene sheet; and
wherein at least two or more of the graphene sheets of the array share a common substrate.

2. The array according to claim 1, wherein the first and second electrical contacts are located at distal portions of each graphene sheet.

3. The array according to claim 1, wherein the plurality of graphene sheets has a tessellating shape.

4. The array according to claim 3, wherein the plurality of graphene sheets are hexagonal, square or rectangular.

5. The array according to claim 4, wherein the surface of the substrate comprises AlN, GaN, AlGaN, BN, InGaN and SiN.

6. The array according to claim 5, wherein the substrate comprises a support selected from the group consisting of Si, $SiO_2$, SiC or Sapphire.

7. The array according to claim 1, wherein the graphene sheets each comprise from 1 to 50 graphene layers.

8. The array according to claim 1, wherein the graphene sheets are doped.

9. The array according to claim 8, wherein the graphene sheets are doped with one or more of Br, N, Mg and P.

10. The array according to claim 1, wherein the graphene sheets are in electrical contact in series or in parallel.

11. The array according to claim 1, wherein the electrical contacts are insulated from the ion-containing fluid.

12. A method of generating electrical energy from the array according to claim 1, the method comprising arranging the array in a flow-path of an ion-containing fluid, whereby the ion-containing fluid passes across the surface of the array to generate a current.

13. A method of making an array of graphene sheets configured to generate electricity from a flow of an ion-containing fluid, the method comprising:
providing a substrate comprising a support selected from the group consisting of Si, $SiO_2$, SiC or Sapphire;
forming a semiconductor layer on the support by MOCVD;
depositing a graphene layer structure having from 1 to 50 layers on the semiconductor layer by MOCVD or CVD;
dividing the graphene layer structure into electrically isolated graphene sheets on the semiconductor layer;
forming first and second electrical contacts on each electrically isolated graphene sheet;
electrically connecting each graphene sheet to at least a further graphene sheet to form the array,
wherein the array comprises a plurality of graphene sheets, each graphene sheet comprises the first and second electrical contacts, having a surface extending between the first and second electrical contacts for contacting the flow of ion-containing fluid; and
wherein at least two or more of the graphene sheets of the array share a common substrate.

14. A device for generating electrical energy from a flow of an ion-containing fluid, the device comprising one or more arrays according to claim 1.

15. The device according to claim 14, wherein the one or more arrays are arranged to generate electricity from a flow of rain water as the ion-containing fluid.

16. The device according to claim 15, wherein the one or more arrays are optically transparent.

17. The device according to claim 14, wherein one or more arrays are arranged to generate electricity from a flow of sea water as the ion-containing fluid.

18. The device according to claim 14, wherein one or more arrays are arranged to generate electricity from a flow of waste fluid.

19. The device according to claim 15, wherein the arrays form a surface of a roof tile, a wall panel, a car body panel, or a drainage duct.

20. The device according to claim 16, wherein the one or more arrays form a surface of a window or a solar panel.

21. The device according to claim 17, wherein the arrays form a surface of a hull of a boat, or a duct or panel within a tidal powder generator.

22. The device according to claim 18, wherein the arrays form a surface of a sanitary-ware product, or a duct for sewage or farm drainage.

\* \* \* \* \*